(12) United States Patent
Miyaharu

(10) Patent No.: US 10,754,255 B2
(45) Date of Patent: Aug. 25, 2020

(54) EXPOSURE APPARATUS AND ARTICLE MANUFACTURING METHOD

(71) Applicant: CANON KABUSHIKI KAISHA, Tokyo (JP)

(72) Inventor: Takafumi Miyaharu, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/508,616

(22) Filed: Jul. 11, 2019

(65) Prior Publication Data
US 2020/0019066 A1    Jan. 16, 2020

(30) Foreign Application Priority Data

Jul. 13, 2018   (JP) .................................. 2018-133431

(51) Int. Cl.
*G03F 7/20* (2006.01)
*G03F 9/00* (2006.01)

(52) U.S. Cl.
CPC ........ *G03F 7/70141* (2013.01); *G03F 7/2024* (2013.01); *G03F 7/70775* (2013.01); *G03F 9/7069* (2013.01)

(58) Field of Classification Search
CPC ............... G03F 7/70141; G03F 7/2024; G03F 7/70775; G03F 9/7069
See application file for complete search history.

(56) References Cited

U.S. PATENT DOCUMENTS

| | | | | |
|---|---|---|---|---|
| 6,151,102 A * | 11/2000 | Nishi | .................. | G03F 7/70358 355/53 |
| 6,714,281 B1* | 3/2004 | Amano | ............... | G03F 7/70641 250/548 |
| 8,009,272 B2 | 8/2011 | Ohkubo | | |
| 8,625,074 B2* | 1/2014 | Matsumoto | ............ | G03B 27/42 355/55 |
| 2002/0041377 A1* | 4/2002 | Hagiwara | ............... | G03F 7/707 356/399 |
| 2003/0025890 A1* | 2/2003 | Nishinaga | ............... | G03F 7/701 355/53 |
| 2006/0103826 A1* | 5/2006 | Kok | ........................ | G03F 7/706 355/67 |

(Continued)

FOREIGN PATENT DOCUMENTS

| | | |
|---|---|---|
| JP | 2003059817 A | 2/2003 |
| JP | 2008294019 A | 12/2008 |

*Primary Examiner* — Deoram Persaud
(74) *Attorney, Agent, or Firm* — Rossi, Kimms & McDowell LLP

(57) ABSTRACT

An exposure apparatus comprises a projection optical system for projecting a pattern of a mask, a substrate stage for holding a substrate, and a measurement device installed on the substrate stage, including a plate on which a substrate-side mark is formed, and a sensor for detecting light transmitted through a mask-side mark, the projection optical system, and the substrate-side mark, and configured to measure an amount of the light detected by the sensor. The substrate-side mark includes a central mark arranged in a center of a sensitive region of the sensor, and a peripheral mark arranged in a periphery of the central mark. The central mark is used in measurement of the light amount, including driving the substrate stage in a direction parallel to an optical axis of the projection optical system.

15 Claims, 10 Drawing Sheets

(56) References Cited

U.S. PATENT DOCUMENTS

| | | | | |
|---|---|---|---|---|
| 2006/0132775 | A1* | 6/2006 | Sengers | G03F 7/706 356/401 |
| 2007/0153251 | A1* | 7/2007 | Ogusu | G03F 9/7026 355/67 |
| 2009/0168038 | A1* | 7/2009 | Akamatsu | G03F 9/7046 355/67 |
| 2009/0219494 | A1* | 9/2009 | Kakuchi | G03F 7/706 355/18 |
| 2009/0280418 | A1* | 11/2009 | Matsuda | G03B 27/32 430/30 |
| 2016/0070175 | A1* | 3/2016 | Akamatsu | G03F 9/7088 355/67 |
| 2017/0017167 | A1* | 1/2017 | Kawanami | G03F 9/7026 |

\* cited by examiner

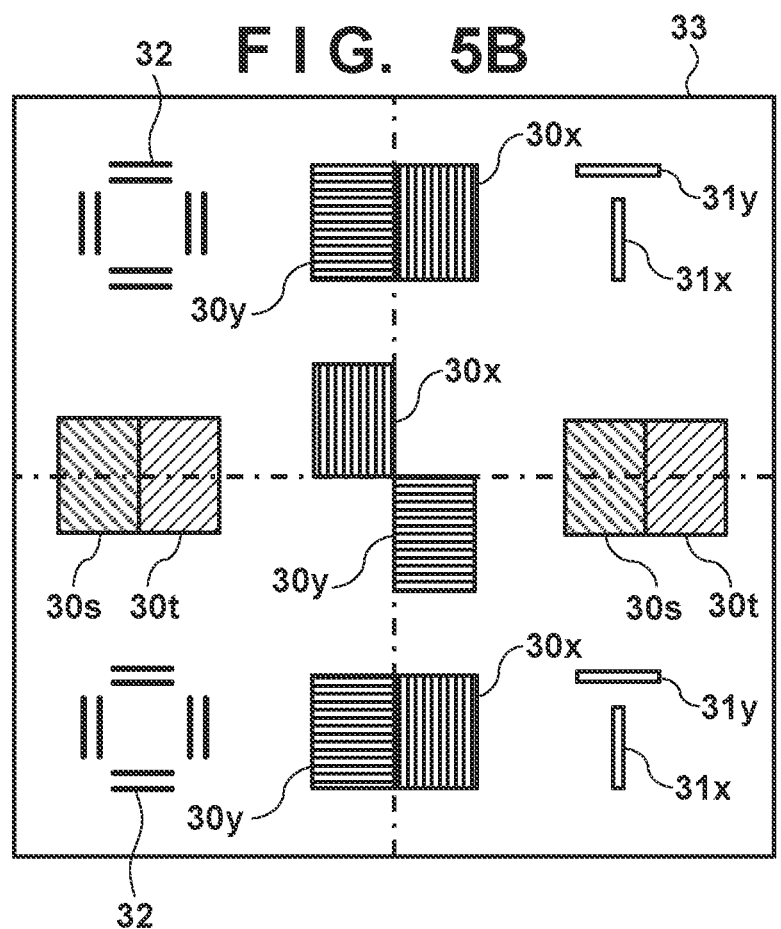
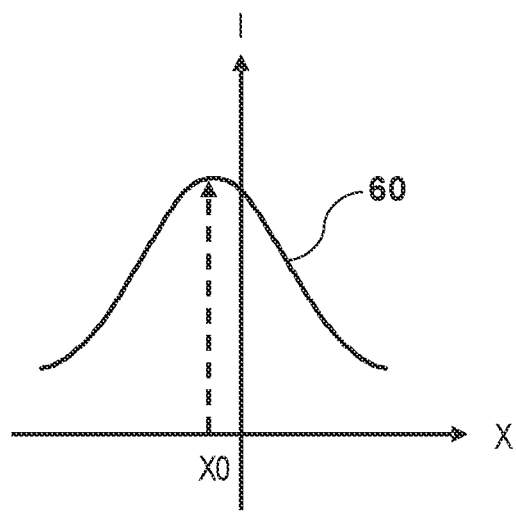
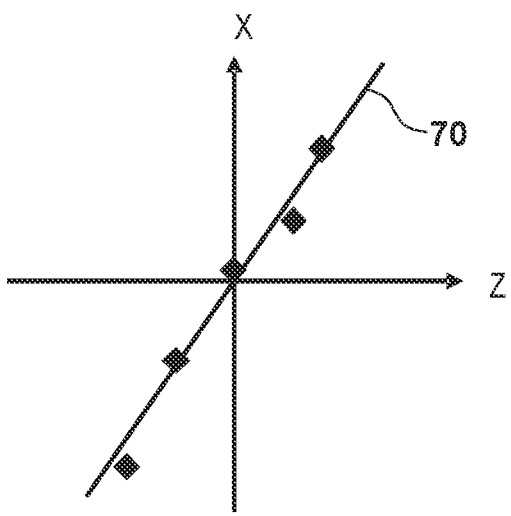

EXPOSURE APPARATUS AND ARTICLE MANUFACTURING METHOD

BACKGROUND OF THE INVENTION

Field of the Invention

The present invention relates to an exposure apparatus and an article manufacturing method.

Description of the Related Art

In an exposure apparatus, the image performances of an illumination optical system and a projection optical system have an influence on CD or overlay. Therefore, the optical characteristics of the illumination optical system and the projection optical system are measured and adjusted by using an aerial image measurement device. Japanese Patent Laid-Open No. 2003-059817 describes a method of measuring the telecentricity of the illumination optical system by performing shifting measurement in a sectional direction perpendicular to the optical axis, while changing the focusing position in the optical-axis direction of an aerial image measurement device. Also, Japanese Patent Laid-Open No. 2008-294019 describes a method of forming alignment marks on a pattern substrate of an aerial image measurement device, and adjusting an image projected by the projection optical system and the pattern substrate in a rotational direction around the optical axis. These aerial image measurement devices include a glass plate having an opening formed by a light shielding member such as a Cr film, and a sensor.

Unfortunately, the conventional aerial image measurement devices pose the problem that a deviation between the center of the opening of the glass plate and the center of a sensitive region of the sensor deceives the detected light amount of a scanning signal, and a measurement error occurs.

SUMMARY OF THE INVENTION

The present invention provides an exposure apparatus advantageous in, for example, reducing measurement errors in mark measurement.

The present invention in its one aspect provides an exposure apparatus comprising a projection optical system configured to project a pattern of a mask held on a mask stage, a substrate stage movable while holding a substrate, and a measurement device installed on the substrate stage, including a plate on which a substrate-side mark is formed, and a sensor for detecting light transmitted through a mask-side mark formed on the mask or the mask stage, the projection optical system, and the substrate-side mark, and configured to measure an amount of the light detected by the sensor, wherein the substrate-side mark includes a central mark arranged in a center of a sensitive region of the sensor, and a peripheral mark arranged in a periphery of the central mark, and the central mark is a mark to be used in measurement of the light amount, which includes driving the substrate stage in a first direction parallel to an optical axis of the projection optical system.

Further features of the present invention will become apparent from the following description of exemplary embodiments (with reference to the attached drawings).

BRIEF DESCRIPTION OF THE DRAWINGS

FIG. 5B is a view showing examples of a plurality of measurement marks in the measurement device;

FIG. 6 is a view exemplarily showing the relationship between the position of the measurement mark in the X direction and the output value of a photoelectric converter;

FIG. 7 is a schematic view showing the telecentricity obtained from the measurement marks;

DESCRIPTION OF THE EMBODIMENTS

Figure 1:
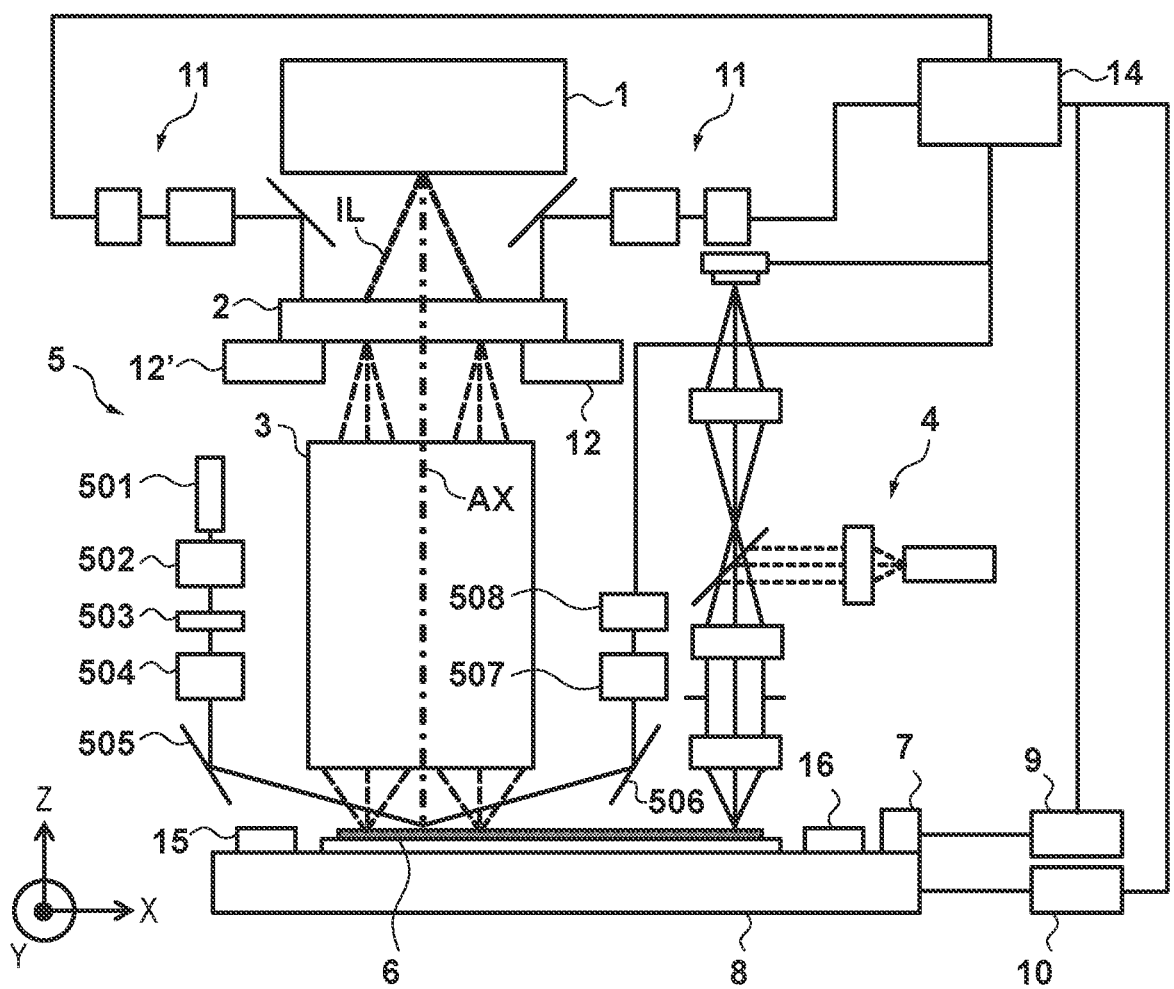
FIG. 1 is a view showing the arrangement of an exposure apparatus according to an embodiment.

Various exemplary embodiments, features, and aspects of the invention will be described in detail below with reference to the drawings.

Embodiments of the present invention will be explained in detail below with reference to the accompanying drawings. Note that the following embodiments are merely practical examples when carrying out the present invention, so the present invention is not limited to the following embodiments. Note also that not all combinations of features explained in the following embodiments are necessarily essential to solve the problem of the present invention. Furthermore, the same reference numerals denote similar members in the drawings, and a repetitive explanation thereof will be omitted.

First Embodiment

FIG. 1 is a view showing the arrangement of an exposure apparatus according to this embodiment. In this specification, directions are indicated in an XYZ coordinate system in which a horizontal plane is an XY plane. Generally, a substrate 6 is placed on a substrate stage 8 such that the surface of the substrate 6 is parallel to the horizontal plane (XY plane), and an optical axis AX of the projection optical system is parallel to the Z axis perpendicular to the XY plane. A controller 14 manages the operation of the exposure apparatus. Light IL emitted from an illumination optical system 1 illuminates a reticle 2 arranged with reference to reticle set marks 12 and 12' formed on a reticle stage (mask stage) (not shown). The reticle 2 is positioned by reticle alignment scopes 11 capable of simultaneously observing the reticle set marks 12 and 12' and reticle set marks (not shown) formed on the reticle 2.

An image of light transmitted through a pattern on the reticle 2 as an original is formed on the substrate 6 by a projection optical system 3, thereby forming an exposure pattern on the substrate 6. The substrate 6 is held on the substrate stage 8 movable in the X-, Y-, and Z-axis directions and in rotational directions around these axes. A stage control system 10 controls the substrate stage 8. A measurement device 15 (also called an aerial image measurement device or a spatial image measurement device) for baseline measurement (to be described later) is installed on the substrate stage 8.

On the other hand, alignment marks (not shown) are formed on the substrate 6, and a dedicated position detector 4 measures the positions of these alignment marks. Note that an interferometer 9 that refers to a mirror 7 always measures the position of the substrate stage 8, and array information of chips formed on the substrate 6 is calculated from the measurement result of the interferometer 9 and the alignment mark measurement result of the position detector 4.

When exposing the substrate 6, alignment must be performed with respect to the focusing position of an image formed by the projection optical system 3, and a focus detector 5 detects the position of the substrate 6 in the focusing direction. In the focus detector 5, light emitted from a light source 501 is obliquely projected, as pattern light defined by a slit 503, onto the substrate 6 by an illumination lens 502, the slit 503, a light-projecting lens 504, and a mirror 505. This pattern light projected onto the substrate 6 is reflected by the substrate surface, and input to a photoelectric converter 508 such as a CCD by a light-receiving lens 507 via a mirror 506 installed on the opposite side. The focusing direction of the substrate 6 can be measured from the position of a slit image obtained by the photoelectric converter 508.

Figure 2:
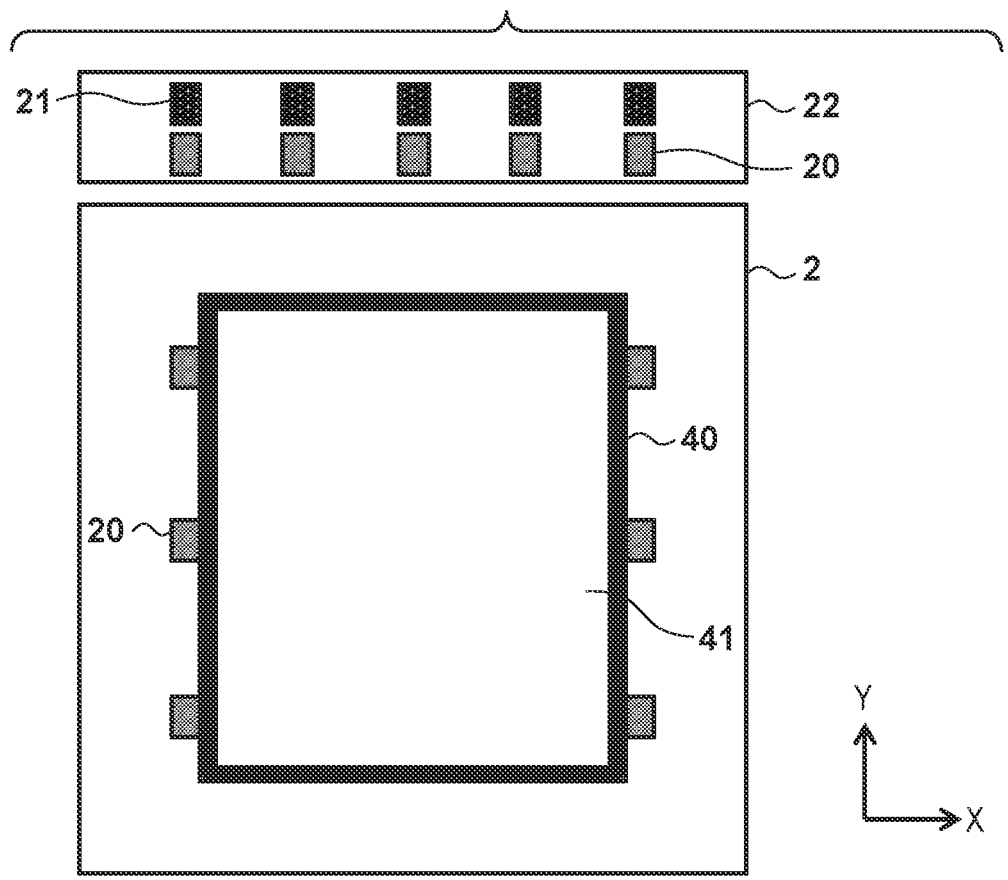
FIG. 2 is a view showing examples of measurement marks in the embodiment.
Figure 3:
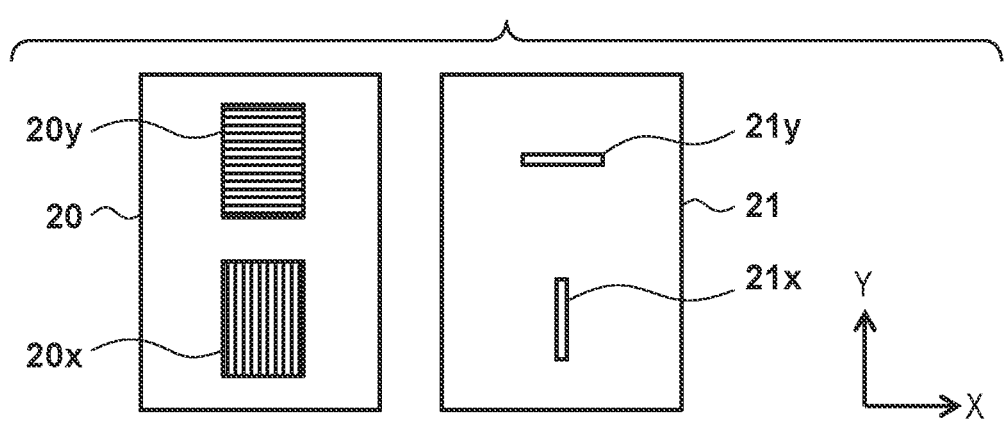
FIG. 3 is a view showing practical examples of measurement marks on the reticle side.
Figure 4:
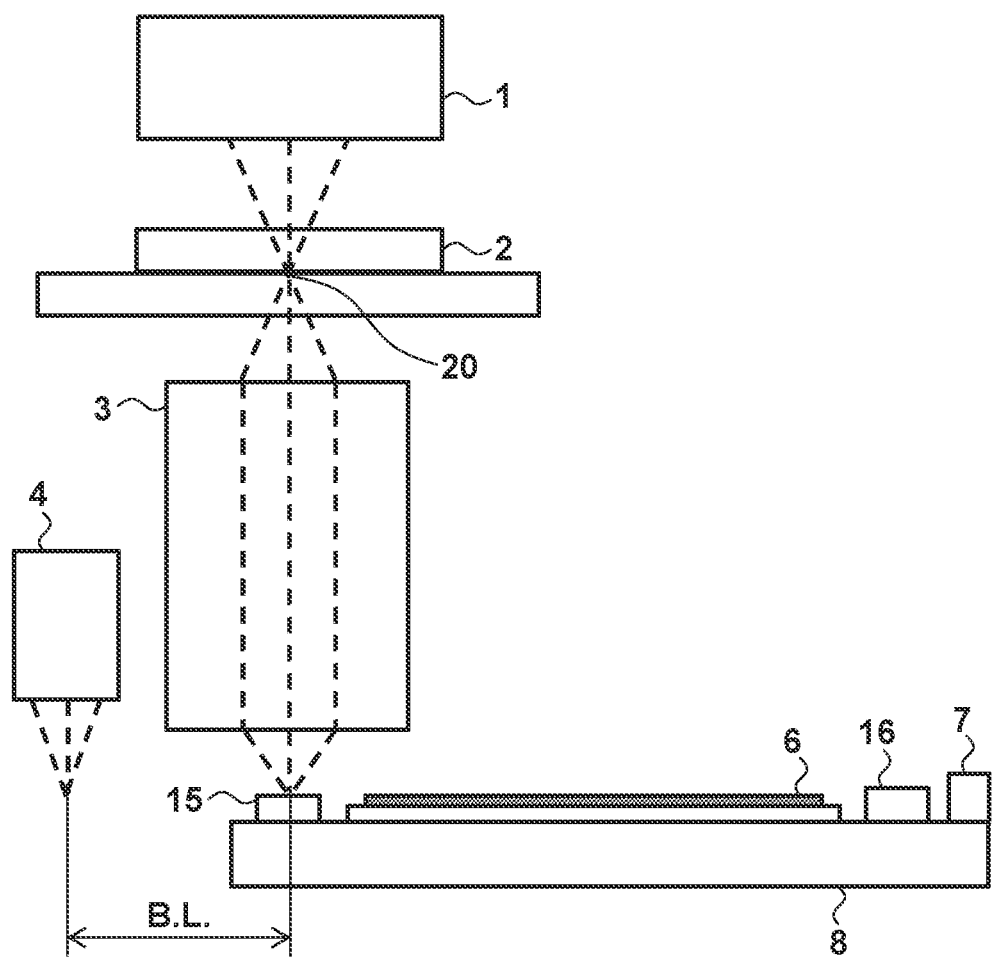
FIG. 4 is a view showing a relative positional relationship (baseline) between a position detector and a reticle.

As described above, the position detector 4 detects the chip array information formed on the substrate 6, but it is necessary to obtain a relative positional relationship (baseline (B.L.)) between the position detector 4 and the reticle 2 as shown in FIG. 4 in advance. An outline of the baseline measurement method will be explained below. FIG. 2 shows reticle-side measurement marks 20 and 21 (mask-side marks) formed on the reticle 2 and the reticle reference plate 22. FIG. 3 shows detailed examples of the measurement marks 20 and 21 shown in FIG. 2. The reticle 2 has an exposure area 41 in which a real element pattern is formed, inside a light shielding zone 40. The measurement marks 20 are formed in the periphery of the light shielding zone 40. As shown in FIG. 3, the measurement marks 20 include a measurement mark 20x for measuring the X direction and a measurement mark 20y for measuring the Y direction. The measurement mark 20x is formed as a repetitive pattern of openings and light shielding portions extending in the Y direction. The measurement mark 20y is formed as a repetitive pattern of openings and light shielding portions extending in the X direction perpendicular to the extending direction of the measurement mark 20x. Note that the extending directions of the measurement marks 20x and 20y need not be parallel to the X or Y direction. For example, the measurement marks 20x and 20y may also extend in a direction inclined by 45° or 135° to the X direction.

As shown in FIG. 2, the exposure apparatus includes the reticle reference plate 22 at the same height as the reticle 2. The reticle reference plate 22 can be driven to a position right above the projection optical system 3 by driving a reticle stage (not shown). The measurement marks 20 and 21 are formed on the reticle reference plate 22, so that calibration measurement can be performed even when the reticle 2 is not mounted on the exposure apparatus. In addition, since a plurality of measurement marks 20 and 21 are arranged on the reticle reference plate 22 in the X direction (a non-scanning direction of the projection optical system 3), these marks can also be used in measurement of the distortion of the projection optical system 3 or the aberration of an image plane. As shown in FIG. 3, the measurement marks 21 include a measurement mark 21x for rough measurement in the X direction, and a measurement mark 21y for rough measurement in the Y direction. The measurement mark 21x is formed by an opening extending in the Y direction, and the measurement mark 21y is formed by an opening extending in the X direction perpendicular to the extending direction of the measurement mark 21x. As shown in FIG. 4, when the illumination optical system 1 illuminates these measurement marks with exposure light, the projection optical system 3 forms an opening pattern image of light transmitted through the measurement marks in a best focus position on the substrate side.

Figure 5A:
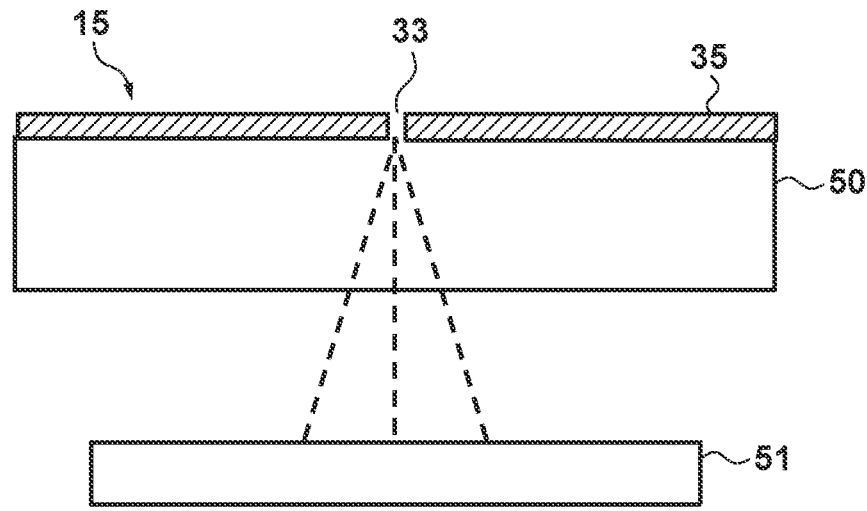
FIG. 5A is a view showing the arrangement of a measurement device.

FIG. 5A shows the configuration of the measurement device 15 arranged on the substrate stage 8. FIG. 5A is a sectional view of the measurement device 15 viewed in the Y direction. The measurement device 15 includes a glass plate 50, and a photoelectric converter 51 (a sensor) arranged below the glass plate 50. A light shielding portion 35 such as a Cr film is formed on the surface of the glass plate 50. A plurality of measurement marks 33 (mask substrate-side marks) are formed in the central portion of the light shielding portion 35. Each of the plurality of measurement marks 33 is formed by light shielding portions having a light shielding property to exposure light, and openings. However, FIG. 5A shows the plurality of measurement marks 33 as a simple opening. Light transmitted from through the mask-side marks, the projection optical system 3, and the mask substrate-side marks arrives at the photoelectric converter 51. The photoelectric converter 51 outputs an electric signal corresponding to the intensity of the received light. Accordingly, the amount (or the intensity) of the light detected by the photoelectric converter 51 can be measured.

FIG. 5B shows examples of the plurality of measurement marks 33. As shown in FIG. 5B, the plurality of measurement marks 33 include measurement marks 30x, 30y, 31x, and 31y equivalent to the measurement marks 20x, 20y, 21x, and 21y on the reticle side, and can also include other measurement marks. For example, measurement marks 30s and 30t can be used to measure an image of a measurement mark having a repetitive pattern of openings and light shielding portions in an oblique direction. In addition, position measurement marks 32 that can be detected by the position detector 4 are also formed. When the position measurement marks 32 are positioned in an observation area of the position detector 4, the positions of the position measurement marks 32 can be obtained from the result detected by the position detector 4 and the result obtained by an interferometer at that time.

The plurality of measurement marks 33 as described above are arranged on the glass plate 50, but the arrangement of the plurality of measurement marks 33 is restricted. A region where the plurality of measurement marks 33 can be arranged is limited because light that illuminates the plurality of measurement marks 33 has an NA and all light components transmitted through the plurality of measurement marks 33 must be detected by the photoelectric converter 51. In addition, the plurality of measurement marks 33 can also include measurement marks 30x, 30y, 30s, and 30t for fine detection, measurement marks 31x and 31y for rough detection, and spare marks thereof. When examining the arrangement of the plurality of measurement marks on the glass plate 50, a measurement mark having a high priority order is arranged near the center on the glass plate 50. A measurement mark having a high priority order is a measurement mark to be used when performing measurement at high accuracy. In FIG. 5B, the measurement marks 30x and 30y are arranged near the center on the glass plate 50.

A method of obtaining the relative position (baseline) of the position detector 4 with respect to the projection optical system 3 by using the optical measurement device 15 will be explained in detail below. First, the controller 14 drives the measurement marks 20x and 20y formed on the reticle 2 to predetermined positions where the exposure light of the projection optical system 3 passes. The following explanation will be made by taking the measurement mark 20x as an example. The same method is applicable to the measurement mark 20y as well. The illumination optical system 1 illuminates the measurement mark 20x driven to the predetermined position with the exposure light. The projection optical system 3 forms an image of the light transmitted through the measurement mark 20x as its mark pattern image in an image formation position on the substrate space. The controller 14 drives the substrate stage 8 to arrange the measurement mark 30x formed in the measurement device 15 and having the same shape as the measurement mark 20x in a position matching the mark pattern image.

In a state in which the measurement device 15 is arranged on the image formation plane (best focus plane) of the measurement mark 20x, the output value of the photoelectric converter 51 is monitored while the measurement mark 30x is driven in the X direction. FIG. 6 shows a schematic graph plotting the X-direction position of the measurement mark 30x and the output value of the photoelectric converter 51. Referring to FIG. 6, the abscissa is the X-direction position of the measurement mark 30x, and the ordinate is an output value I of the photoelectric converter 51. As shown in FIG. 6, when the relative positions of the measurement mark 20x and the measurement mark 30x are changed, the obtained output value also changes. On a change curve 60, the output is maximum in a position (X0) where the light having passed through the measurement mark 20x matches the opening of the measurement mark 30x. By obtaining the position X0, it is possible to obtain the position of the projected image of the measurement mark 20x, which is formed on the substrate space side by the projection optical system 3. Note that a stable accurate measurement value of the detection position X0 is obtained by calculating a peak position in a predetermined region of the obtained change curve 60 by barycenter calculation, function approximation, or the like.

The measurement in the X direction has been explained above. However, the positions of projected images of the measurement marks 20x and 20y formed by the projection optical system 3 can also be detected by similarly performing detection by using the measurement mark 30y corresponding to the measurement mark 20y. Note that the above explanation has been made on the assumption that the measurement device 15 exists on the best focus pane of a projected image. In an actual exposure apparatus, however, the focusing direction (Z direction) is undermined in some cases. In this case, the best focus plane can be obtained by monitoring the output value of the photoelectric converter 51 while driving the measurement device 15 in the Z direction. In a case like this, the best focus plane can be calculated by similar processing by regarding the abscissa as the focusing position and the ordinate as the output value I in the graph shown in FIG. 6.

Note that if the measurement device 15 deviates in the X and Y directions and the Z direction, measurement is performed in one direction to obtain the position at predetermined accuracy, and then the position is detected in another direction. By alternately repeating this process, it is finally possible to calculate an optimum position. For example, in a state in which the measurement device 15 deviates in the Z direction, the measurement device 15 is driven in the X direction, and low-accuracy measurement is performed in the X direction, thereby calculating a rough position in the X direction. After that, the measurement device 15 is driven in the Z direction in the same position, and the best focus plane is calculated. Then, the measurement device 15 is driven in the X direction again in the best focus plane, and measurement is performed. This makes it possible to accurately obtain an optimum position in the X direction. Normally, accurate measurement can be performed by performing alternate measurement once as described above. Note that measurement in the X direction is performed first in the above example, but it is finally possible to perform accurate measurement even when measurement in the Z direction is performed first.

From the foregoing, the XY positions of the projected images of the measurement marks 20x and 20y are calculated by using the measurement device 15. After that, the controller 14 drives the measurement device 15 toward the position detector 4, and the position detector 4 detects the position of the position measurement mark 32. The relative positions (baseline) of the projection optical system 3 and the position detector 4 can be calculated by using the driving amount of the substrate stage 8 and the detection result of the position detector 4.

The measurement device 15 is also used to measure the telecentricity indicating the inclinations of principal rays of the illumination optical system 1 and the projection optical system 3. If the telecentricity is large when the substrate 6 is exposed, an image shift occurs, and this causes an overlay error. Therefore, the telecentricity is measured by using the measurement device 15, and adjusted by, for example, driving the lenses of the illumination optical system 1 and the projection optical system 3. An example of a sequence for measuring the telecentricity by using the measurement device 15 will be explained below. The controller 14 drives the measurement marks 21x and 21y formed on the reticle reference plate 22 to a position where exposure light of the projection optical system 3 passes. The explanation will be made by taking the measurement mark 21x as an example. The same method is applicable to the measurement mark 21y as well. The controller 14 drives the substrate stage 8, and arranges, in a position where the measurement mark 31x matches a mark pattern image, the measurement mark 31x having the same shape as the measurement mark 21x and arranged on the measurement device 15. First, Z-direction measurement is performed in order to obtain a best focus position in the Z direction. Then, X-direction measurement is performed in the positions of a plurality of points in the Z direction, based on the obtained best focus position in the Z direction. As shown in FIG. 7, an inclination in the X direction with respect to the Z direction, that is, telecentricity 70 can be calculated by using the value in the X direction calculated in each position in the Z direction.

Figure 8A:
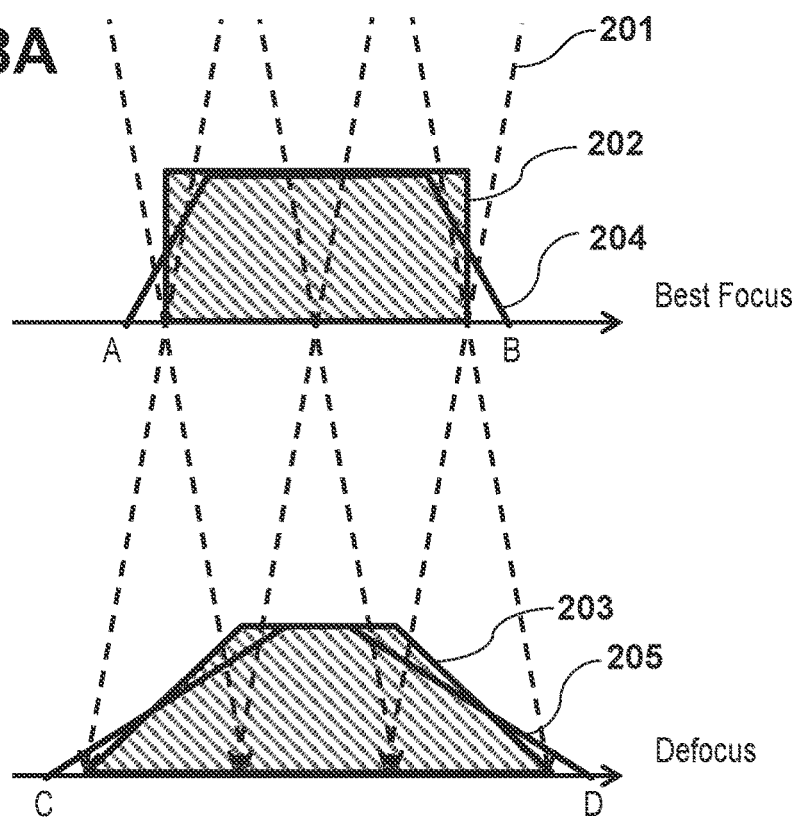
FIG. 8A is a view for explaining conditions under which no telecentricity measurement error occurs.
Figure 8B:
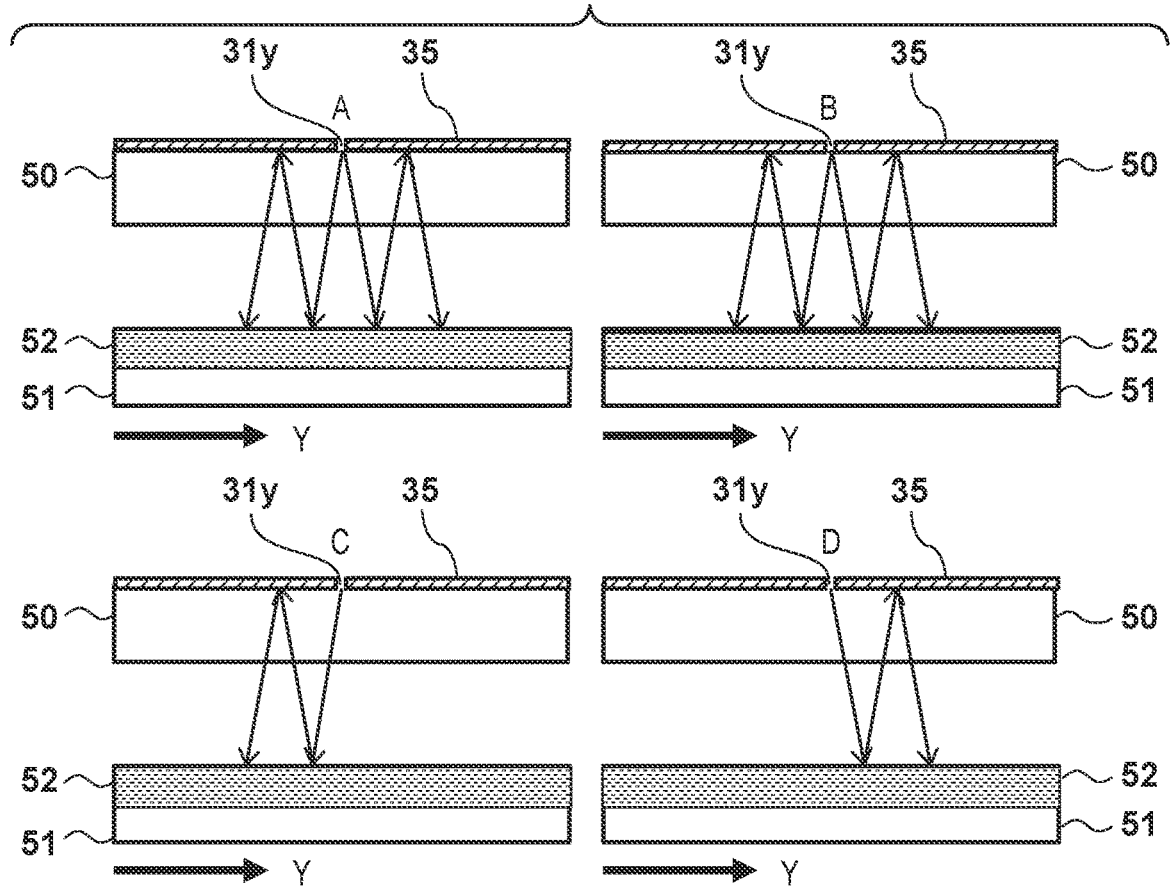
FIG. 8B is a view for explaining the conditions under which no telecentricity measurement error occurs.
Figure 9A:
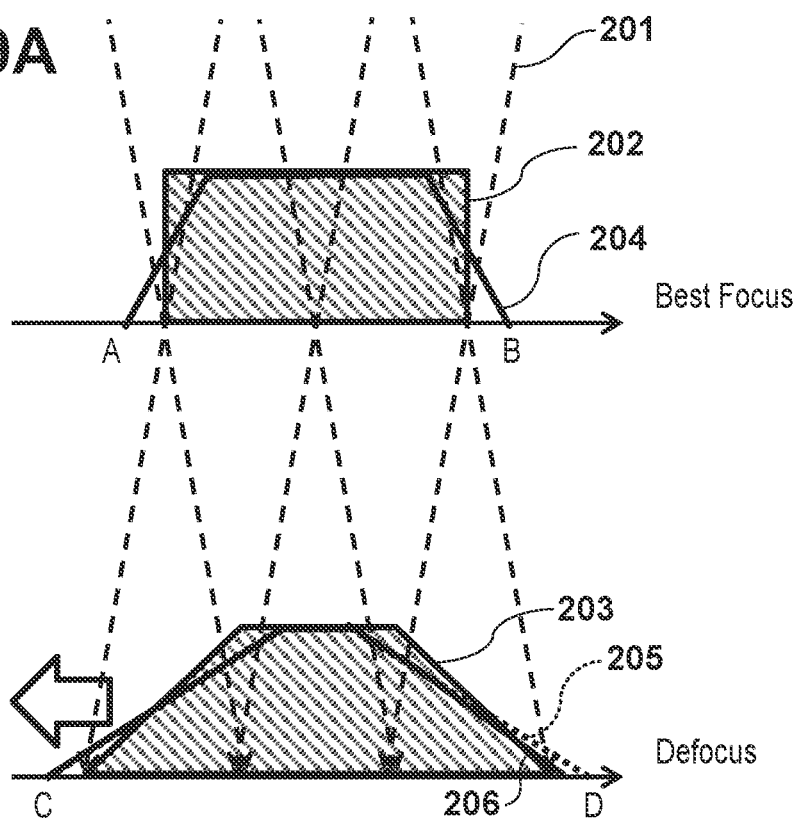
FIG. 9A is a view for explaining conditions under which a telecentricity measurement error occurs.
Figure 9B:
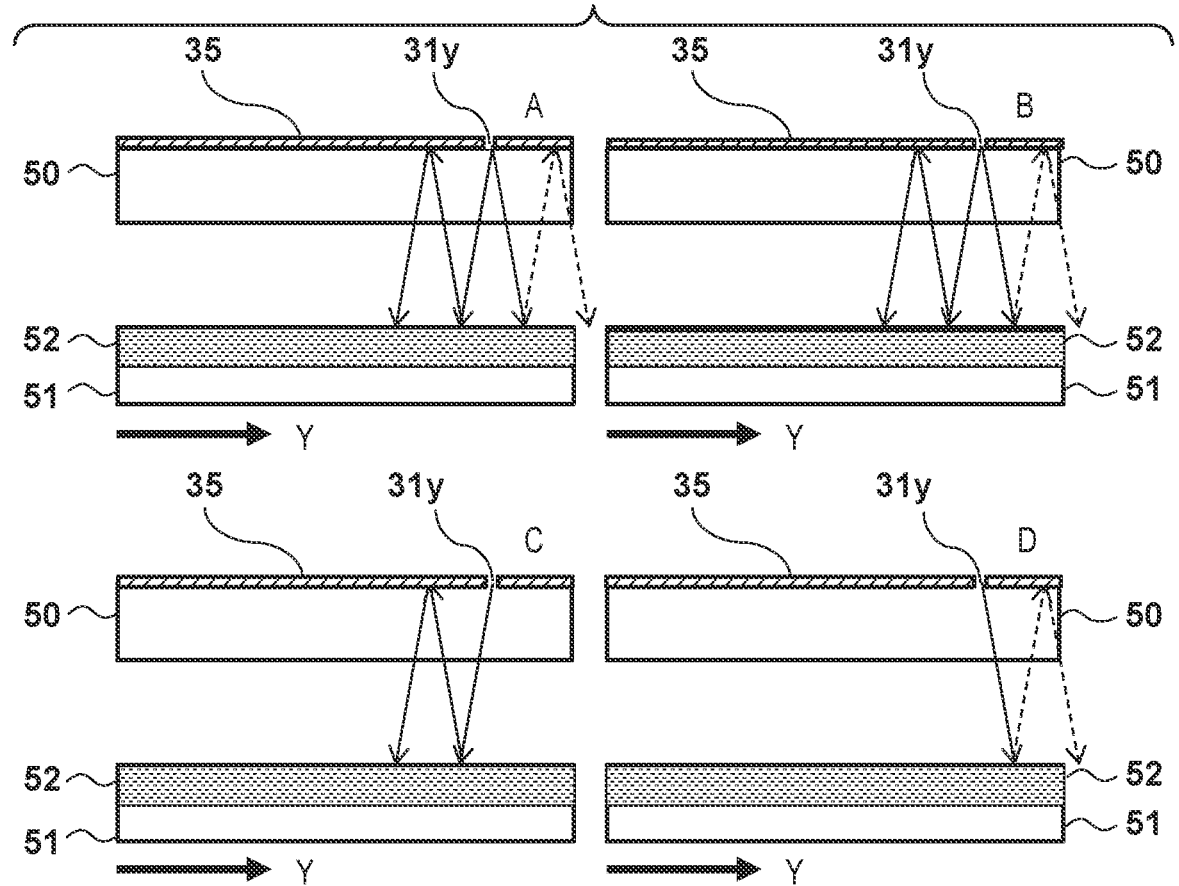
FIG. 9B is a view for explaining the conditions under which a telecentricity measurement error occurs.

A problem when measuring the telecentricity by using the measurement device 15 will be explained below. FIGS. 8A and 8B illustrate conditions under which no telecentricity measurement error occurs. FIGS. 9A and 9B illustrate conditions under which a telecentricity measurement error occurs. FIG. 8A is a schematic view of a scanning signal when the illumination distribution of light emitted from the illumination optical system 1 is measured by using the measurement device 15. Illumination light 201 from the illumination optical system 1 illuminates a best focus plane and a defocus plane. Hatched portions indicate an illumination distribution 202 on the best focus plane and an illumination distribution 203 on the defocus plane. In the illumination distribution 202 on the best focus plane, the inclination of the ends is large. By contrast, in the illumination distribution 203 on the defocus plane, the inclination of the ends is small, and the distribution spreads. A scanning signal 204 indicates a scanning signal when the measurement device 15 scans and measures the illumination distribution 202. A scanning signal 205 indicates a scanning signal when the measurement device 15 scans and measures the illumination distribution 203.

FIG. 8B shows light traces in the measurement device 15 when points A and B at the two ends of the illumination distribution 202 and points C and D at the two ends of the illumination distribution 203 are scanned and measured in the Y direction by using the measurement device 15. FIG. 8B will be explained by taking the measurement mark 31y of the plurality of measurement marks 33 (FIG. 5B) as an example. FIG. 8B also shows a sensitive region 52 of the photoelectric converter 51. The measurement mark 31y is arranged in the center of the sensitive region 52 of the photoelectric converter 51. At both of the points A and B, light reflected once by the glass plate 50 and the sensitive region 52 of the photoelectric converter 51 is detected. On the other hand, the point C is measured in a defocused position, so the illumination light 201 illuminates one side. Likewise, the opposite side is illuminated for the point D. Since, however, the measurement mark 31y is arranged in the center of the sensitive region 52 of the photoelectric converter 51, detected light amounts measured at the points C and D are equal. Accordingly, no barycenter change occurs in the scanning signals 204 and 205. As a consequence, no measurement error occurs in the scanning signals 204 and 205.

Next, the principle that causes a telecentricity measurement error will be explained with reference to FIGS. 9A and 9B. FIGS. 9A and 9B illustrate a case in which the position of the measurement mark 31y deviates from the center of the sensitive region 52 of the photoelectric converter 51. Like FIG. 8B, FIG. 9B shows light traces in the measurement device 15 when the points A and B at the two ends of the illumination distribution 202 and the points C and D at the two ends of the illumination distribution 203 are scanned and measured in the Y direction by using the measurement device 15. At the points A and B, reflected light can be detected once on only one side of the illumination light 201. One-time reflected light on the opposite side is not detected because the light falls outside the sensitive region 52 of the photoelectric converter 51. Accordingly, the detected light amount of the scanning signal 204 reduces at the points A and B. However, the barycenter position does not change because the scanning signal 204 bisymmetrically changes. At the point C, light reflected once by the glass plate 50 and the sensitive region 52 of the photoelectric converter 51 is detected. On the other hand, at the point D, one-time reflected light falls outside the sensitive region 52 of the photoelectric converter 51 and is not detected. In the arrangement of the measurement device 15 shown in FIG. 9A, therefore, the waveform of the scanning signal 205 changes to a scanning waveform 206 when measured. In the scanning waveform 206, the barycenter changes because the detected light amount reduces only on the side of the point D. This causes a measurement error in the Y direction in which measurement is performed in the defocus position. At the points A and B on the best focus plane, no measurement error occurs in the Y direction, so a telecentricity measurement error occurs.

Assuming that defocus shown in FIG. 9A is +defocus, the condition of −defocus is as follows. This case can be regarded as the same as the case shown in FIG. 9A, that is, the sign of a barycenter shift is inverted for −defocus. Accordingly, barycenter shifts having different signs occur for ±defocuses, so a telecentricity measurement error occurs. Note that FIGS. 8B and 9B have been explained under the conditions using the measurement mark 31y. However, it is obvious that a measurement error occurs in a barycenter measurement value in the X direction even when using the measurement mark 31x.

As described above, when the center of the sensitive region 52 of the photoelectric converter 51 of the measurement device 15 and the positions of the measurement marks 31x and 31y are deviated, a measurement error occurs in barycenter measurement in the defocus position, and this causes a telecentricity measurement error. A case in which the relative positions (baseline) of the projection optical system 3 and the position detector 4 are calculated will be explained below. A positional deviation in the X and Y directions is measured by arranging the measurement device 15 on the best focus plane of a projected image. When taking account of the measurement reproducibility and the like, however, it is impossible to perform measurement in the X and Y directions in a perfect best focus position. Therefore, even when measuring the XY position by using the measurement marks 30x and 30y, a measurement error occurs in the XY position due to defocus described above.

Figure 10A:
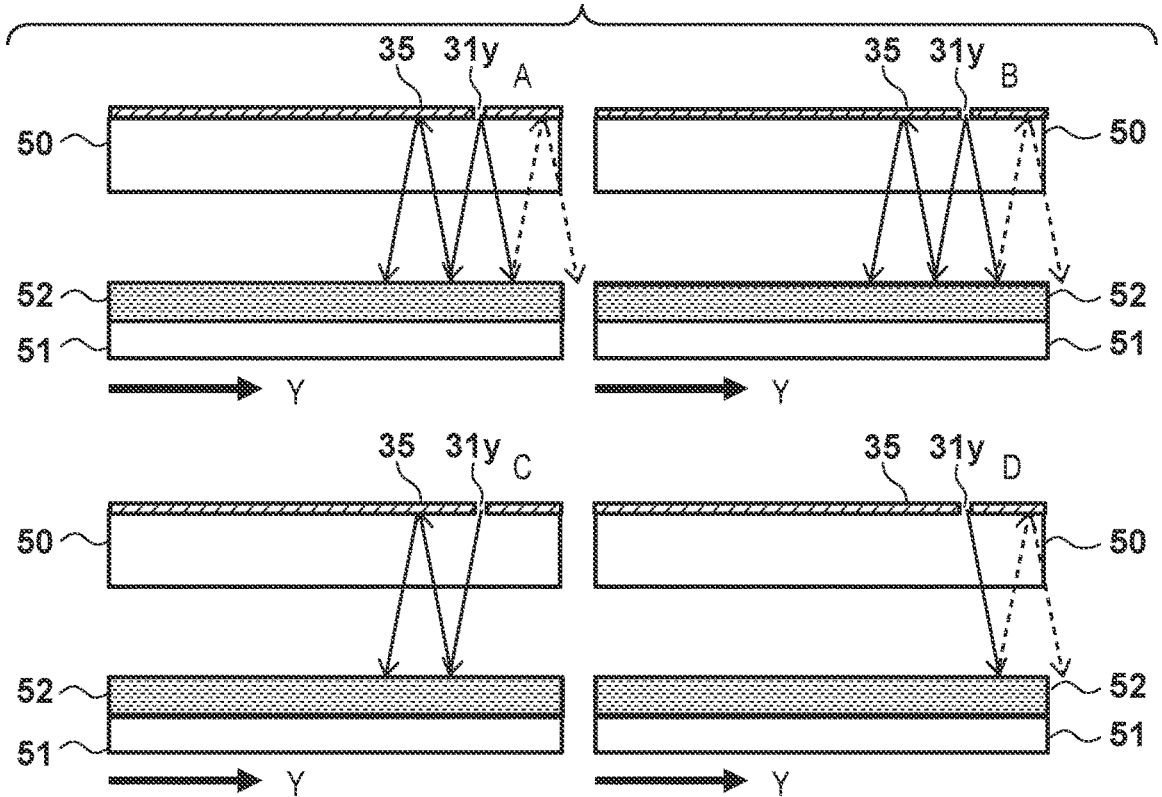
FIG. 10A is a view showing the way a telecentricity measurement error occurs in a measurement device including a lens.
Figure 10B:
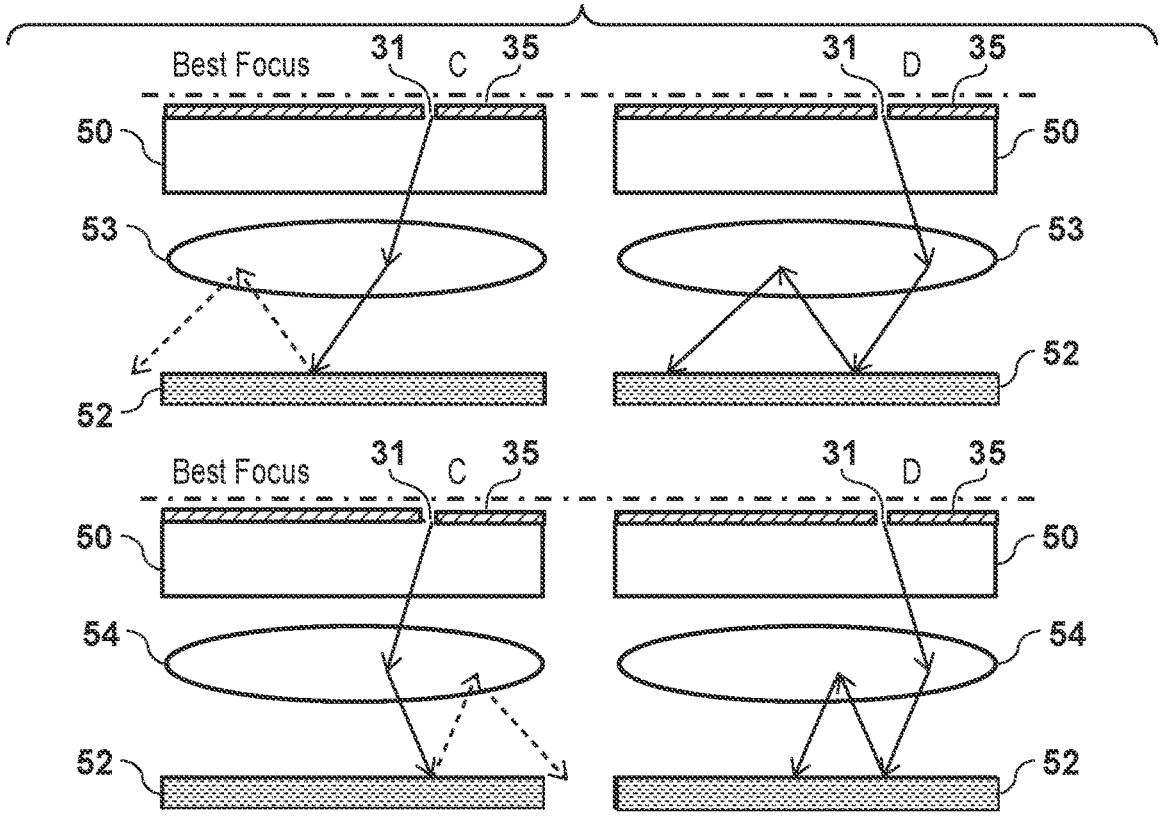
FIG. 10B is a view showing the way a telecentricity measurement error occurs in the measurement device including a lens.

The measurement device 15 shown in FIG. 5A does not include a lens having a curvature. As shown in FIGS. 10A and 10B, however, a measurement error can similarly occur even in a measurement device including a lens. FIG. 10A is a schematic view of a measurement device 300 in which the pattern surface of the glass plate 50 and the surface of the sensitive region 52 form a Fourier transform optical system, and a measurement device 301 in which they form an image formation optical system. A Fourier transform optical system 53 is formed in the measurement device 300, and an image formation optical system 54 is formed in the measurement device 301. Like FIG. 9B, FIG. 10B shows light traces of the measurement devices 300 and 301 at the points C and D. As shown in FIG. 10B, a detected light amount reduces in measurement at the point C. Consequently, a barycenter shift occurs in a scanning waveform, and this causes a measurement error in the XY position.

As described above, a deviation between the measurement mark and the center of the sensitive region of the photoelectric converter causes a measurement error during XY measurement on the defocus plane regardless of the arrangement of the measurement device. As shown in FIG. 5B, the plurality of measurement marks 33 are formed on the measurement device. For example, when the measurement mark 31x is arranged in the center of the sensitive region of the photoelectric converter 51, measurement errors occur in the remaining measurement marks 30x, 30y, and 31y.

Figure 11A:
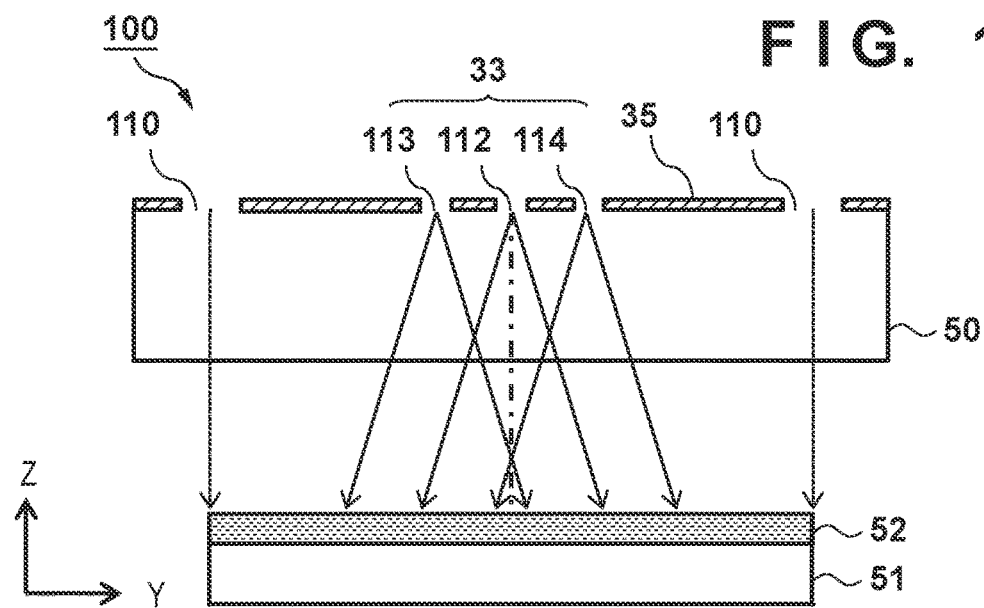
FIG. 11A is a view showing the arrangement of a measurement device according to the embodiment.
Figure 11B:
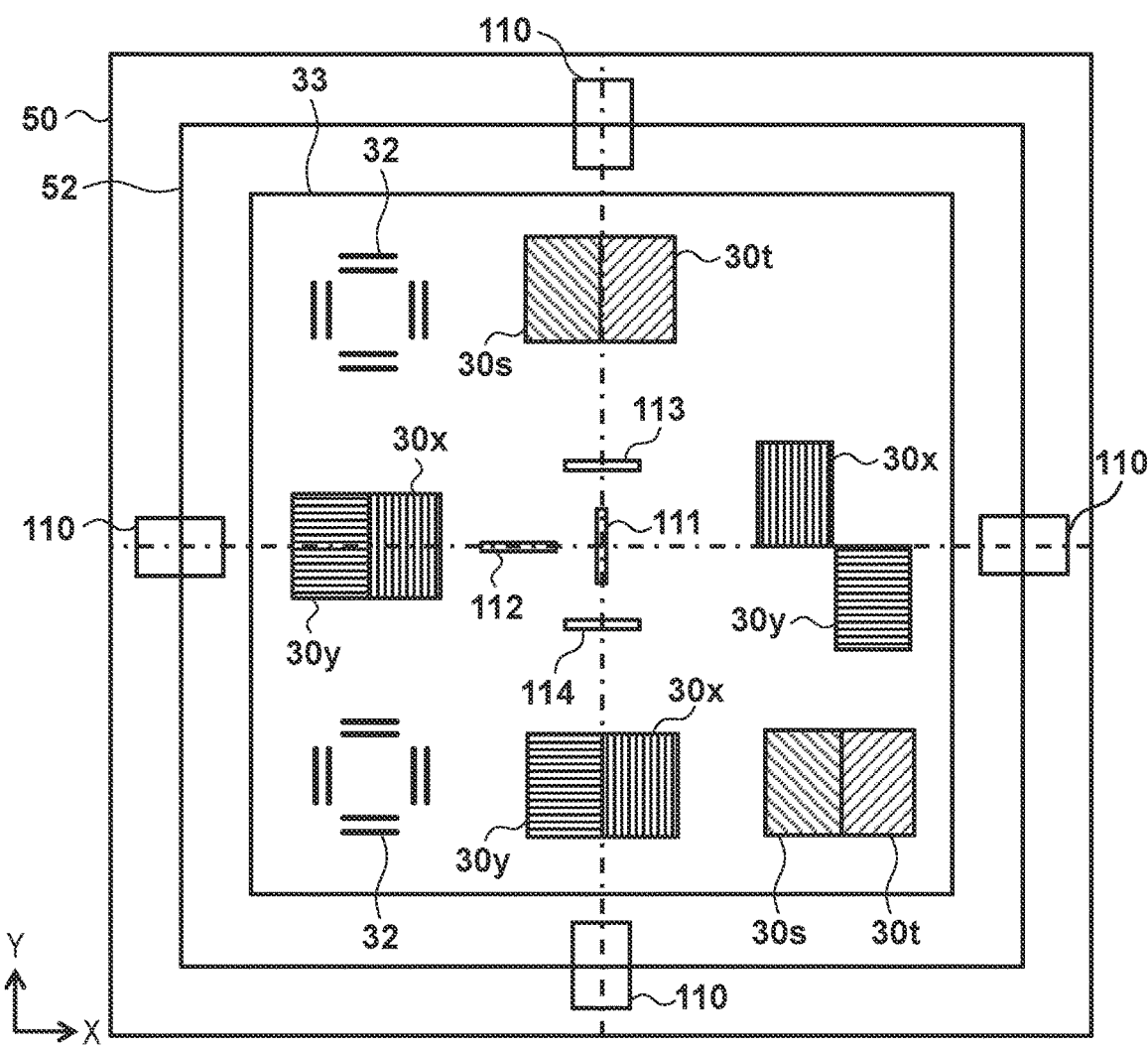
FIG. 11B is a view showing examples of a plurality of measurement marks in the measurement device according to the embodiment.

FIGS. 11A and 11B illustrate the arrangement of a measurement device 100 that reduces XY measurement errors caused by a deviation between the measurement mark and the center of the sensitive region of the photoelectric converter. FIG. 11A is a YZ sectional view of the measurement device 100, and FIG. 11B is a plan view of the XY plane when the measurement device 100 is viewed in a +Z direction. The plurality of measurement marks 33 include measurement marks 111, 112, 113, and 114. The measurement mark 111 is an X-direction measurement mark, and the measurement marks 112, 113, and 114 are Y-direction measurement marks. In the example shown in FIG. 5B, the measurement marks 30x, 30y, 30s, and 30t requiring accurate measurement are arranged near the center on the glass plate 50, that is, near the center of the sensitive region 52 of the photoelectric converter 51. By contrast, in the measurement device 100 shown in FIG. 11B, the measurement marks 111, 112, 113, and 114 that must be measured as they are defocused from the image plane of the projection optical system 3 are arranged near the center of the sensitive region 52 of the photoelectric converter 51. The measurement marks 30x, 30y, 30s, and 30t requiring accurate measurement in the X and Y directions are formed in positions far from the center of the sensitive region 52 than the measurement marks 111, 112, 113, and 114.

In other words, the plurality of measurement marks 33 as substrate-side marks include central marks (the measurement marks 111 to 114) arranged in the center of the sensitive region 52 of the sensor, and peripheral marks (the measurement marks 30x, 30y, 30s, and 30t) arranged in the periphery of the central marks. The central marks are marks to be used to measure the light amount when driving the substrate stage 8 in the Z direction (a first direction) parallel to the optical axis AX of the projection optical system 3.

The following explanation will be made by using the measurement marks 111, 112, 113, and 114 equivalent to the measurement mark 31y shown in FIG. 5B. However, the same method is obviously applicable even when using other marks.

Referring to FIG. 11B, the measurement mark 111 is a first central mark having a shape extending in the Y direction (a third direction) parallel to the surface of the sensitive region 52 and perpendicular to the X direction (a second direction), and this mark is arranged in the central position in the X direction. Accordingly, multiple reflected light between the glass plate 50 and the sensitive region 52 becomes bisymmetrical, so no X measurement error occurs. The measurement mark 112 is a second central mark having a shape extending in the X direction, and this mark is arranged in the central position in the Y direction. Consequently, multiple reflected light between the glass plate 50 and the sensitive region 52 becomes bisymmetrical, so no Y measurement error occurs. The measurement marks 111 and 112 having these arrangements can reduce XY measurement errors.

The vicinity of the center of the plurality of measurement marks 33, that is, the vicinity of the center in the X and Y directions of the sensitive region 52 shown in FIG. 11B is a region where XY measurement errors can be reduced and a demand to be able to arrange measurement marks is high. Accordingly, the arrangements for reducing measurement errors of measurement marks even when measurement marks, of the plurality of measurement marks 33, for which the measurement accuracy is most important are arranged near the center of the sensitive region 52 in the X and Y directions, are the measurement marks 113 and 114 as a pair of third central marks. The measurement marks 113 and 114 are arranged in positions located on the central line of the sensitive region 52 parallel to the X direction or the Y direction (in FIG. 11B, the Y direction), and symmetrical to the center of the sensitive region 52. Consequently, the distance from the center of the sensitive region 52 to the center of the measurement mark 113 in the Y direction as the measurement direction matches the distance from the center of the sensitive region 52 to the center of the measurement mark 114 in the Y direction as the measurement direction. As can be predicted from FIG. 11A, Y measurement errors caused by multiple reflected light in the measurement device 100 occur with different signs in the measurement marks 113 and 114. When using the measurement marks 113 and 114, Y measurement errors that occur can be canceled by measuring the measurement marks 113 and 114 and averaging the measurement results.

The process of measuring the telecentricity as described above can be performed by using the central mark explained with reference to FIGS. 11A and 11B. As described above, the process of measuring the telecentricity includes the process of obtaining the amount of positional deviation from the central mark in the X or Y direction (second direction), which occurs when the substrate stage is driven in the Z direction (first direction), of an image of the mask-side mark. The use of the central mark makes it possible to suppress the occurrence of a telecentricity measurement error as explained with reference to FIGS. 9A and 9B.

The central mark can also be used in a process of determining the best focus position in the Z direction by measuring the light amount while driving the substrate stage in the Z direction.

The central mark can further be used in a process of determining the amount of positional deviation from the central mark in the second direction, of an image of the mask-side mark projected by the projection optical system, by measuring the light amount while driving the substrate stage in the X or Y direction (second direction).

Figure 11C:
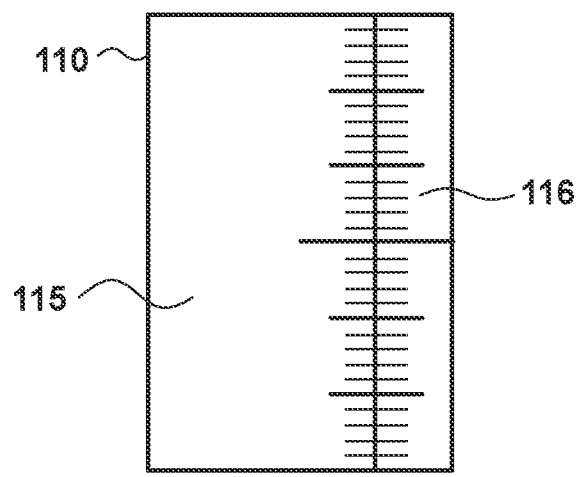
FIG. 11C is a view showing an example of an alignment mark in the measurement device according to the embodiment.

The arrangement of the measurement device 100 that reduces XY measurement errors in relation to the arrangement of the measurement marks on design has been explained. When actually manufacturing the measurement device, however, assembly matching designed values without any assembly errors is impossible. Therefore, a method of reducing XY measurement errors caused by assembly errors will be explained below. The measurement device 100 shown in FIGS. 11A and 11B includes alignment marks 110 for aligning the glass plate 50 and the sensitive region 52 of the photoelectric converter 51. FIG. 11C shows an example of the alignment mark 110. The alignment mark 110 has an opening 115 and a scale 116 because it is necessary to measure a positional deviation between the surface of the glass plate 50 on which the plurality of measurement marks 33 are formed and the surface of the sensitive region 52 of the photoelectric converter 51. It is possible to measure the end face by focusing on the surface of the sensitive region 52 through the opening 115, and measure the positional deviation by using the scale 116 by focusing on the surface of the glass plate 50 on which the plurality of measurement marks 33 are formed.

As described above, during the assembly of the measurement device 100, XY measurement errors can be reduced by measuring the positional deviation between the glass plate 50 and the sensitive region 52, and performing adjustment based on the measurement result.

A method of correcting an XY measurement value by using the amount of deviation between the center of the opening of the measurement mark and the center of the sensitive region 52 will be explained below. By correcting an XY measurement value by using the amount of center deviation of the measurement mark on design, it is possible to obviate the need for two-time measurement of the measurement marks 113 and 114, and reduce XY measurement errors even by one-time measurement. It is, of course, also possible to correct an XY measurement value by using the result of the amount of deviation, which is measured by using the alignment marks 110 and includes manufacturing errors, between the center of the opening of the measurement mark and the center of the sensitive region 52.

As a method of calculating a correction amount for correcting an XY measurement value, a method of performing geometric simulation is available. The reflectance of the glass plate 50 and the surface of the light shielding portion 35, the reverse-surface transmittance and reflectance of the glass plate 50, and the reflectance of the surface of the sensitive region 52 of the photoelectric converter 51 are already known. Therefore, the percentage of the amount of detected light, which falls outside the sensitive region 52 of the photoelectric converter 51, can be calculated by tracing rays of multiple reflected light in the measurement device 100. That is, it is possible to predict a decrease in detected light amount of a scanning signal, and predict a barycenter shift amount caused by a measurement error of a scanning signal.

Second Embodiment

Figure 12:
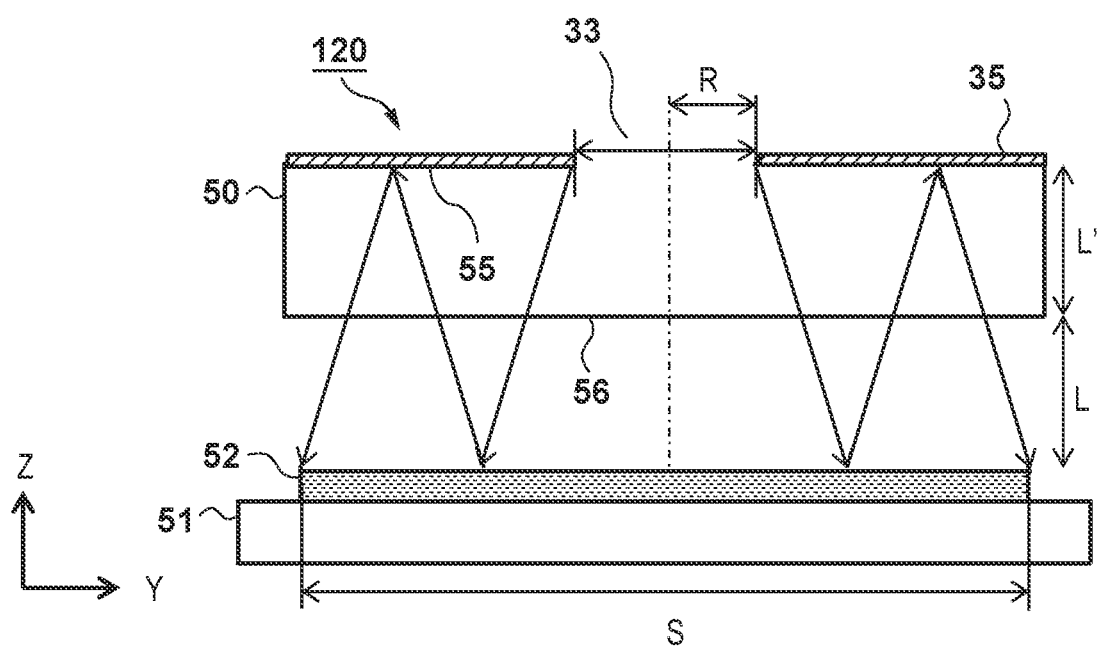
FIG. 12 is a view showing the arrangement of a measurement device according to an embodiment.

Conditions that limit the arrangement of a measurement device in order to reduce XY measurement errors caused by the deviation between a measurement mark and the center of a sensitive region of a photoelectric converter will be explained below with reference to FIG. 12. FIG. 12 shows the arrangement of a measurement device 120. Light traces in the measurement device 120 will be described below. A sensitive region 52 of a photoelectric converter 51 detects light rays transmitted through a plurality of measurement marks 33, but reflects a part of the light. The light reflected by the sensitive region 52 is transmitted through a reverse surface 56 of a glass plate 50, and illuminates a boundary surface 55 between the glass plate 50 and a light shielding portion 35. The light shielding portion 35 is formed by a Cr film or the like. Accordingly, the boundary surface 55 between the glass plate 50 and the light shielding portion 35 has a high reflectance. On the other hand, an antireflection film or the like can be formed on the reverse surface 56 of the glass plate 50, so the reflectance of the reverse surface 56 of the glass plate 50 is low. That is, the influence which the reflected light from the reverse surface 56 of the glass plate 50 has on XY measurement errors is small. Also, the light reflected by the boundary surface 55 is reflected again by the sensitive region 52. However, the amount of light detected by the sensitive region 2 after the light goes and returns twice between the boundary surface 55 and the sensitive region 52 is presumably sufficiently small. Accordingly, it is probably possible to sufficiently reduce XY measurement errors even when taking account of only light that is reflected by the sensitive region 52 and returns to the sensitive region 52 after being reflected again by the boundary surface 55.

Let S be the size (for example, the length in the Y direction) of the sensitive region 52, L be the distance between the rear surface 56 of the glass plate 50 and the sensitive region 52, L' be the thickness of the glass plate 50, n be the refractive index of the glass plate 50, and NA be the numerical aperture of an illumination mode to be measured. Letting R be the opening radius of the plurality of measurement marks 33 (central marks), a region where the plurality of measurement marks 33 can be arranged so as to reduce XY measurement errors is represented by:

$$R \leq S/2 - 3 \cdot (L \cdot \tan(a\sin(NA)) + L' \cdot \tan(a\sin(NA/n)))$$

That is, the central marks are preferably arranged in a region within the radius R represented by the above equation from the center of the sensitive region. In the above equation, a coefficient of 3 in the second term of the right-hand side means that light passes the distance between the boundary surface 55 and the sensitive region 52 once during measurement and multiple reflected light passes the distance twice. Therefore, when taking account of the multiple reflected light that goes and returns twice between the boundary surface 55 and the sensitive region 52 in order to further reduce XY measurement errors, the coefficient need only be changed to 5 because light passes once during measurement and the multiple reflected light passes four times.

Third Embodiment

The arrangement of a measurement device when a photoelectric converter 51 uses a sensor including a plurality of photoelectric conversion elements will be explained below. An exposure apparatus generally includes a plurality of measurement devices, but it is desirable to reduce the total number of measurement devices by sharing the measurement devices as much as possible. Therefore, a case in which a scanning signal similar to a reference mark is obtained by using a measurement device including a sensor having a plurality of photoelectric conversion elements will be explained.

Figure 13:
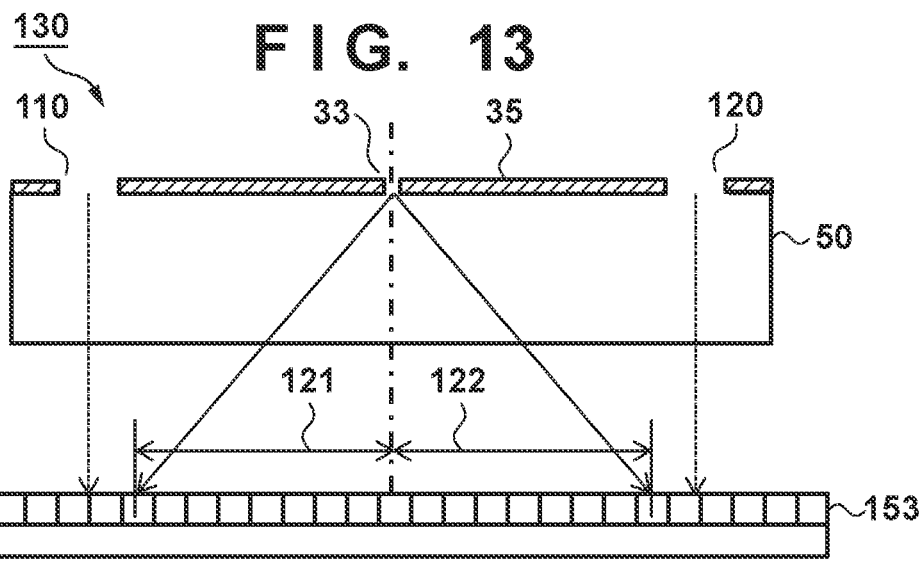
FIG. 13 is a view showing the arrangement of a measurement device according to an embodiment.

FIG. 13 is a view showing the arrangement of a measurement device 130 including a sensor 153 having a plurality of photoelectric conversion elements. The measurement device 130 includes a glass plate 50 and a plurality of measurement marks 33. The measurement device 130 also includes an alignment mark 110 for measuring a positional deviation between the sensor 153 and the glass plate 50. Like the plurality of measurement marks 33, the alignment mark 110 has an opening of a light shielding portion 35, and illumination light having very small σ illuminates the alignment mark. The Y-direction relative positions of the plurality of measurement marks 33 and the sensor 153 can be measured by detecting light transmitted through the alignment mark 110 by the sensor 153. By setting an opening to be measured of the plurality of measurement marks 33 as a start point, episcopic ranges 121 and 122 to the sensor 153 are calculated by using the numerical aperture of an illumination mode to be measured. During scanning measurement, the outputs of only photoelectric conversion elements in the episcopic ranges 121 and 122 are integrated. When the episcopic ranges 121 and 122 have the same value, that is, when the openings of the plurality of measurement marks 33 are centrosymmetric, XY measurement errors caused by multiple reflection can be reduced. It is, of course, also possible to calculate episcopic ranges in the X direction in the same manner as in the Y direction. In addition, the episcopic range is determined by the numerical aperture of an illumination mode and hence can also be calculated as a circular episcopic range on the surface of the sensor 153.

Fourth Embodiment

Figure 14:
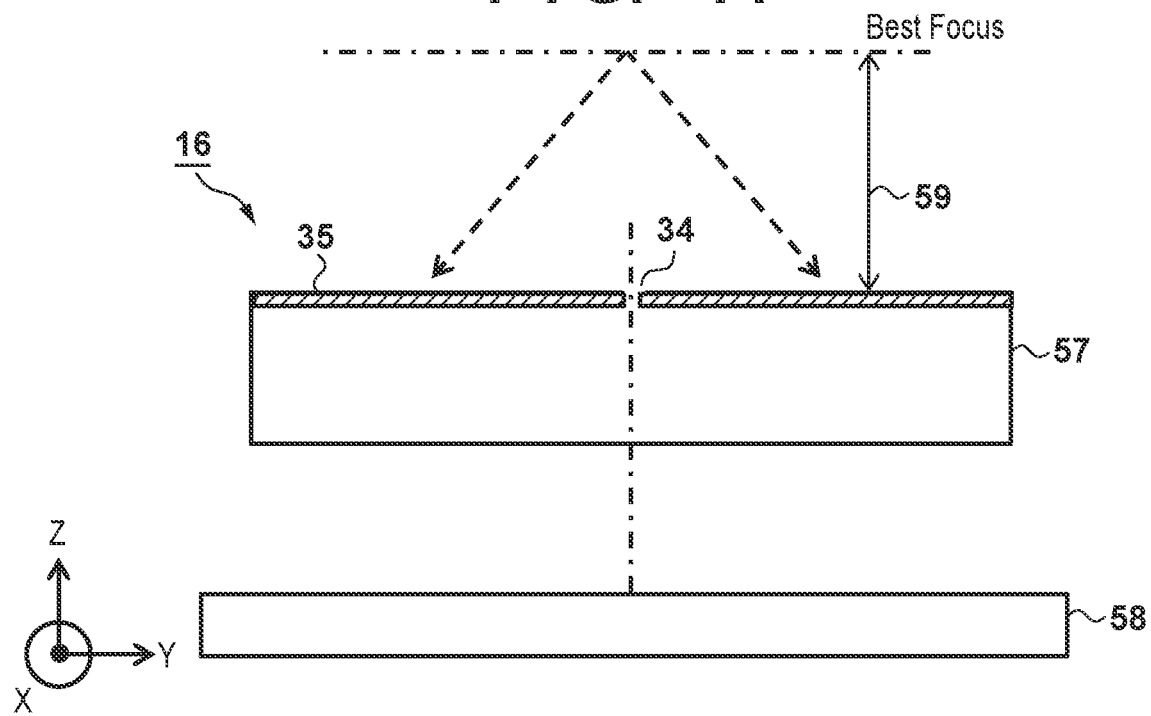
FIG. 14 is a view showing the arrangement of a measurement device for measuring the pupil distribution of an illumination optical system according to an embodiment.

A measurement device for measuring the pupil distribution of an illumination optical system 1 will be explained below. In an exposure apparatus shown in FIG. 1, a measurement device 16 for measuring the pupil distribution of the illumination optical system 1 is arranged on a substrate stage 8. FIG. 14 shows the arrangement of the measurement device 16. The measurement device 16 includes a glass plate 57, and a sensor 58 arranged below the glass plate 57. A light shielding portion 35 such as a Cr film is formed on the surface of the glass plate 57. A measurement mark 34 is formed in the central portion of the light shielding portion 35. The measurement mark 34 can be an opening formed in the light shielding portion 35. The sensor 58 can be a light amount sensor and can also be a sensor having a plurality of photoelectric conversion elements. When the sensor 58 has a plurality of photoelectric conversion elements, the pupil distribution of the illumination optical system 1 can be measured by simultaneous measurement or one-dimensional step measurement by the plurality of photoelectric conversion elements. When the sensor 58 is a light amount sensor, the pupil distribution of the illumination optical system 1 can be measured by two-dimensional step measurement by the light amount sensor.

The detected light amount of the sensor 58 may be deceived by a deviation between the centers of the measurement mark 34 and the sensor 58 in the measurement device 16 as well. A method of measuring the pupil distribution of the illumination optical system 1 by using the measurement device 16 will be explained below. A controller 14 drives an opening (not shown) of a reticle reference plate 22 to a designated XY image height of a projection optical system 3. When the illumination optical system 1 illuminates the opening of the reticle reference plate 22 in a designated illumination mode after that, an image of the opening is formed in an image formation plane position of the projection optical system 3. In a position defocused by a designated amount 59 from the image formation plane position of the projection optical system 3, two-dimensional step measurement is performed in the X and Y directions by using the measurement device 16. In this state, the detected light amount is deceived by multiple reflection in the measurement device 16 as described above. In this embodiment, therefore, the center of the measurement mark 34 and that of the sensor 58 are matched. This makes it possible to reduce measurement errors of the detected light amount.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described patterning method or lithography apparatus on a photosensitive agent applied on a substrate (an exposure step of exposing the substrate), and a development step of developing the substrate on which the latent pattern has been formed in the above step. In addition, the manufacturing method includes other well-known steps (for example, oxidation, film formation, deposition, doping, planarization, etching, resist removal, dicing, bonding, and packaging). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-133431, filed Jul. 13, 2018, which is hereby incorporated by reference herein in its entirety.

What is claimed is:

1. An exposure apparatus comprising:
a projection optical system configured to project a pattern of a mask held on a mask stage;
a substrate stage movable while holding a substrate; and
a measurement device installed on the substrate stage, including a plate on which a substrate-side mark is formed, and a sensor for detecting light transmitted through a mask-side mark formed on the mask or the mask stage, the projection optical system, and the substrate-side mark, and configured to measure an amount of the light detected by the sensor,
wherein the substrate-side mark includes a plurality of measurement marks including a central mark arranged in a center of a sensitive region of the sensor, and a peripheral mark arranged in a periphery of the central mark, and the central mark is a mark to be used in measurement of the light amount, which includes driving the substrate stage in a first direction parallel to an optical axis of the projection optical system, and the peripheral mark is a mark to be used in an alignment in a direction perpendicular to the first direction.

2. The apparatus according to claim 1, wherein the central mark is a mark to be used in a process of measuring telecentricity indicating an inclination of principal light of the projection optical system.

3. The apparatus according to claim 2, wherein the process of measuring the telecentricity includes a process of obtaining an amount of positional deviation from the central mark in a second direction perpendicular to the first direction, which occurs when the substrate stage is driven in the first direction, of an image of the mask-side mark projected by the projection optical system.

4. The apparatus according to claim 1, wherein the central mark is a mark to be used in a process of determining a best focus position in the first direction by measuring the light amount while driving the substrate stage in the first direction.

5. The apparatus according to claim 1, wherein the central mark is a mark used in a process of measuring the light amount while performing driving in a second direction perpendicular to the first direction at each position of the first direction, thereby determining an amount of positional deviation from the central mark in the second direction, of an image of the mask-side mark projected by the projection optical system.

6. The apparatus according to claim 5, wherein the central mark includes a first central mark having a single opening having a shape extending in a third direction parallel to a surface of the sensitive region and perpendicular to the second direction, and the first central mark is arranged in a central position of the sensitive region in the second direction.

7. The apparatus according to claim 6, wherein the central mark further includes a second central mark having a single opening having a shape extending in the second direction, and the second central mark is arranged in a central position of the sensitive region in the third direction.

8. The apparatus according to claim 6, wherein the central mark further includes a pair of third central marks, each having a single opening, arranged in positions on a central line of the sensitive region, which is parallel to the second direction or the third direction, and symmetrical with respect to a center of the sensitive region.

9. The apparatus according to claim 1, wherein the peripheral mark includes an alignment mark for aligning the plate and the sensitive region.

10. The apparatus according to claim 9, wherein the alignment mark includes an opening and a scale,
an end face of the sensitive region is measured, in a state in which a surface of the sensitive region is focused through the opening, and
a positional deviation between the plate and the sensitive region is measured using the scale, in a state in which a surface of the plate is focused.

11. The apparatus according to claim 1, wherein letting S be a size of the sensitive region, L be a distance between a reverse surface of the plate and the sensitive region, L' be a thickness of the plate, n be a refractive index of the plate, and NA be a numerical aperture of an illumination mode to be measured, the central mark is arranged in a region within a radius R represented by:

$$S/2 - 3 \cdot (L \cdot \tan(a\sin(NA)) + L' \cdot \tan(a\sin(NA/n)))$$

from a center of the sensitive region.

12. An article manufacturing method comprising:
exposing a substrate by using an exposure apparatus according to claim 1; and
developing the substrate exposed in the exposing,
wherein an article is manufactured from the substrate developed in the developing.

13. The apparatus according to claim 1, wherein the peripheral mark includes a mark formed as a repetitive pattern of openings and light shielding portions.

14. The apparatus according to claim 1, wherein different measurement results are obtained in measurement using the central mark and measurement using the peripheral mark.

15. The apparatus according to claim 1, wherein the central mark is arrange at a position closer to the center of the sensitive region than a position of the peripheral mark.

* * * * *